(12) United States Patent
Fricke et al.

(10) Patent No.: US 6,717,215 B2
(45) Date of Patent: Apr. 6, 2004

(54) MEMORY STRUCTURES

(75) Inventors: Peter Fricke, Corvallis, OR (US); Andrew L. Van Brocklin, Corvallis, OR (US); Andrew Koll, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/177,240

(22) Filed: Jun. 21, 2001

(65) Prior Publication Data

US 2004/0000678 A1 Jan. 1, 2004

(51) Int. Cl.[7] ............................................... H01L 27/12
(52) U.S. Cl. .................. 257/347; 257/301; 257/306; 257/347; 438/240; 438/678
(58) Field of Search ...................... 257/347, 301, 257/306, 530; 438/240, 678

(56) References Cited

U.S. PATENT DOCUMENTS

| 5,286,993 | A |   | 2/1994  | Lowrey et al. |       |
|-----------|---|---|---------|---------------|-------|
| 5,485,031 | A |   | 1/1996  | Zhang et al.  |       |
| 5,506,518 | A |   | 4/1996  | Chiang        |       |
| 5,625,220 | A |   | 4/1997  | Liu et al.    |       |
| 5,835,396 | A |   | 11/1998 | Zhang         |       |
| 5,866,938 | A |   | 2/1999  | Takagi et al. |       |
| 5,926,415 | A |   | 7/1999  | Shin          |       |
| 5,962,910 | A |   | 10/1999 | Hawley et al. |       |
| 6,002,607 | A |   | 12/1999 | Dvir          |       |
| 6,034,882 | A |   | 3/2000  | Johnson et al.|       |
| 6,185,121 | B1|   | 2/2001  | O'Neill       |       |
| 6,185,122 | B1|   | 2/2001  | Johnson et al.|       |
| 6,251,720 | B1| * | 6/2001  | Thakur et al. | 438/240 |
| 6,269,018 | B1| * | 7/2001  | Monsma et al. | 365/145 |
| 6,344,413 | B1| * | 2/2002  | Zurcher et al.| 438/678 |
| 6,355,969 | B1|   | 3/2002  | Skala et al.  |       |
| 6,479,854 | B1| * | 11/2002 | Thakur et al. | 257/306 |
| 2002/0185684 | A1 | * | 12/2002 | Campbell et al. | 257/347 |

* cited by examiner

*Primary Examiner*—Son L. Mai
*Assistant Examiner*—Dao H. Nguyen

(57) ABSTRACT

A memory structure that includes a first electrode, a second electrode, a thermal conduction limiting electrode having a thermal conductivity that is less than a thermal conductivity of the first electrode, a memory storage element disposed between the thermal conduction limiting electrode and the second electrode, and a control element disposed between the second electrode and the first electrode.

47 Claims, 8 Drawing Sheets

MEMORY STRUCTURES

BACKGROUND OF THE DISCLOSURE

As computer and other electrical equipment continue to drop in price, the manufacturers of storage devices, such as memory devices and hard drives, are forced to lower the cost of their components. At the same time, computer, video game, television and other electrical device markets are requiring increasingly larger amounts of memory to store images, photographs, videos, movies, music and other storage intensive data. Thus, besides reducing cost, manufacturers of storage devices must also increase the storage density of their devices. Memory storage is implemented in a variety of memory technologies such as floppy drives, hard drives, optical drives, and semiconductor memories. Semiconductor memories can be implemented using integrated circuit processes, and a consideration with integrated circuit processes is the need to avoid contamination which reduces yield. There is accordingly a need for semiconductor memory structures that can be efficiently made.

BRIEF DESCRIPTION OF THE DRAWINGS

Features and advantages of the disclosure will readily be appreciated by persons skilled in the art from the following detailed description when read in conjunction with the drawing wherein.

DETAILED DESCRIPTION OF THE DISCLOSURE

Figure 1:
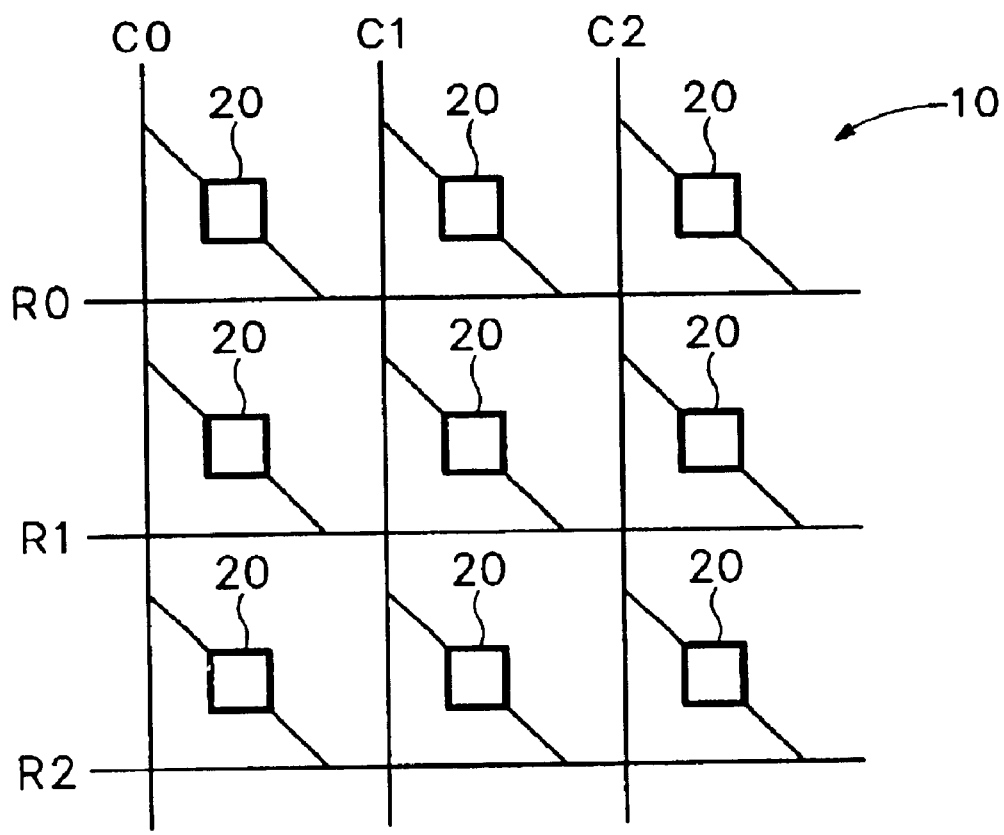
FIG. 1 is a schematic diagram of an embodiment of a cross-point memory array in which the disclosed memory cell structures can be utilized.

FIG. 1 is a simplified schematic diagram of an embodiment of a cross-point memory array 10 in which the disclosed memory cell structures can be utilized. The memory arrangement 10 includes row selection conductor lines R0, R1, R2 and column selection conductor lines C0, C1, C2. A memory cell 20 is connected between each row selection conductor line R0, R1, R2 and each column selection conductor line C0, C1, C2. It should be appreciated that the row selection conductor lines and the column selection conductor lines are referred to by "row" and "column" terminology for convenience, and that in actual implementations the memory cells 20 do not necessarily have to be physically arranged in rows and columns. Each memory cell is basically uniquely accessed or selected by a first selection line and a second selection line that can be oriented in different ways. Also, the column lines do not have to be orthogonal to the row lines, but are illustrated in that manner for ease of understanding.

Figure 2:
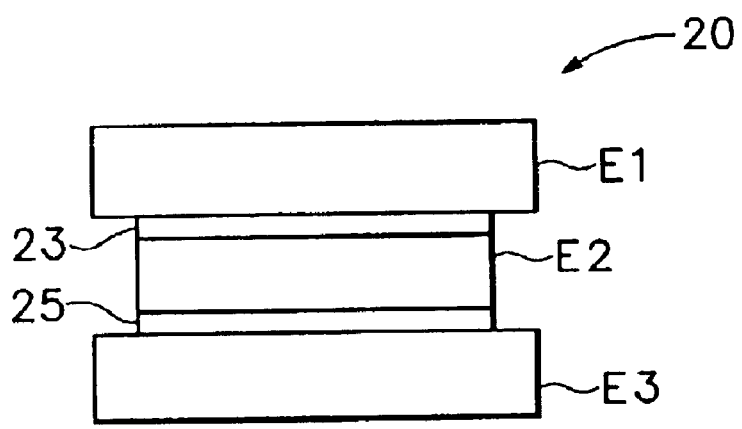
FIG. 2 is a schematic block diagram of a memory cell that includes a memory storage element and a control element for the memory storage element.

FIG. 2 is a simplified electrical block diagram of an embodiment of the memory cell 20 which includes a memory storage element 23 that is electrically connected to a control element 25 by an electrode E2. The memory storage element 23 and the control element 25 are serially connected between an electrode E1 and an electrode E3. The electrodes E1–E3 are conductive elements such as conductors, conductive regions or other conductive features, and it should be appreciated that each of the electrodes can be formed of one or more electrically conductive elements.

One or more of the electrodes E1–E3 includes a thermal conduction limiting conductor structure that is configured to have a thermal conductivity that, is less than that of any electrode of the memory cell that is not a thermal conduction limiting conductor. For example, a thermal conduction limiting conductor structure can have a thermal conductivity that is in the range of about 0.1 to 0.5 times the thermal conductivity of an electrode that is not a thermal conduction limiting conductor. By way of illustrative example, the thermal conduction limiting conductor structure comprises titanium, tungsten, tantalum and/or alloys thereof, and is made of a material that is different from any electrode of the memory cell that is not a thermal conduction limiting conductor. Thermal conduction limiting can also be achieved by shape, for example a reduced conduction path cross-sectional area. The thermal conduction limiting conduction structure reduces thermal conduction between the memory storage element 23 and the electrode. The effect of limiting the thermal conduction is to reduce the time required to change the state of the memory storage element.

The memory storage element 23 can be an antifuse device, such as a programmable tunnel junction device. The antifuse device can be either a dielectric rupture type device or a tunnel junction device. The tunnel junction can be formed from oxidized metal, thermally grown oxide, or deposited oxides or nitrides. The memory storage element may also be embodied with semiconductor materials such as polysilicon, polycrystalline silicon, amorphous silicon, microcrystalline silicon, metal filament electro migration, trap induced hysterisis, ferroelectric capacitor, Hall effect, and polysilicon resistors. Other embodiments of the memory storage element include tunneling magneto-resistive or capacitive elements as floating gates. Still further, the memory storage element can be a read only LeComber or silicide switch or a re-writable phase-change material including a write-erase-write phase change material. The memory storage element can also be a PIN diode or a Schottky diode.

The control element 25 can be a tunnel junction device or PN, PIN or Schottky diodes. Other diodes that can be used include Zener diodes, avalanche diodes, tunnel diodes, and a four layer diode such as a silicon controlled rectifier. Also, the control element 25 can be a junction field effect or bipolar transistor. The control element 25 is sized sufficiently to carry an adequate current such that the state of the storage element 23 can be changed. When the control element is a diode, it can be formed using doped polysilicon, amorphous silicon, or microcrystalline silicon.

For ease of discussion, the disclosed memory structures are described, by way of illustrative examples, as employing tunnel junction devices as the memory storage elements and control elements, and it should. be appreciated that the memory storage elements and control elements can be implemented as described above.

By way of illustrative examples, the disclosed memory structures are schematically depicted as integrated circuits that include interlayer dielectric (ILD) such as silicon dioxide, silicon nitride, or TEOS (tetraethylorthosilicate) that provide support and isolation between various structures of an integrated circuit. The ILD can be deposited using several different technologies such as chemical vapor deposition (CVD), atmospheric pressure CVD, low pressure CVD, plasma enhanced CVD, physical vapor deposition (PVD), and sputtering. For convenience, regions and layers of such dielectric are identified in the drawings by the reference designation ILD.

In the disclosed memory structures, at least one of the memory storage element 23 and the control element 25 is buried or non-etched since such element is formed without being subjected to further processing such as etching. For example, the buried element can be formed on an electrode without being etched, and is capped, covered or buried by another electrode that completely overlaps the buried element and can for example extend beyond a portion of the perimeter of the buried element. In this manner, the later formed covering electrode protects the buried element from contamination during subsequent processing and after completion of manufacture. Having the protection of a protective electrode during further processing, which can increase yield in the manufacture of the memory structures. By way of specific example, the layer in which the buried or covered element is formed is not etched in the process of making the memory structure. Also, the buried element can be more particularly configured such that it can be covered or capped with an electrode without being etched before such electrode is deposited.

Figure 3:
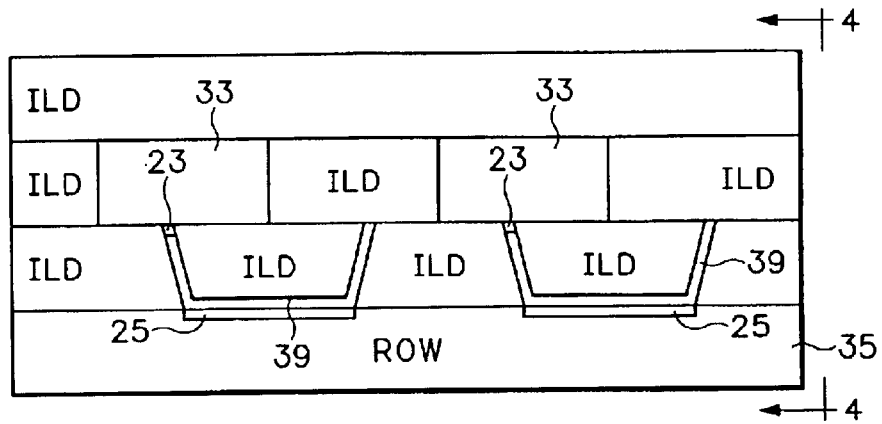
FIGS. 3 and 4 are sectional views that schematically depict an embodiment of a memory structure that includes a thermal conduction limiting conductor.
Figure 4:
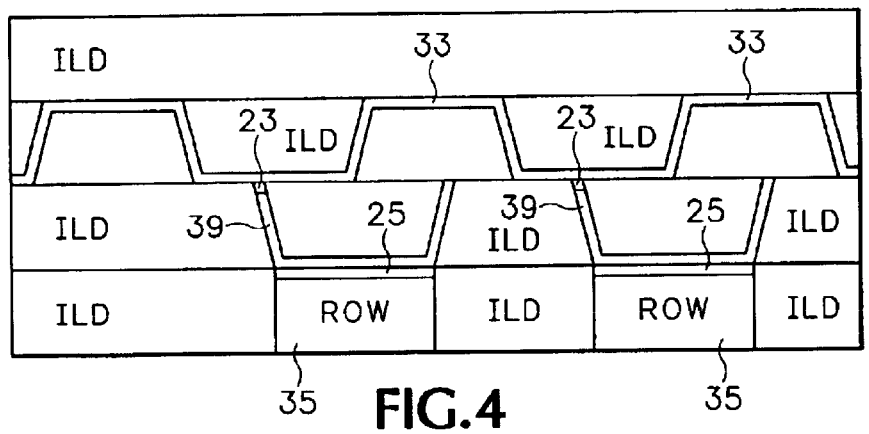

FIGS. 3 and 4 schematically depict an embodiment of a memory structure that includes a plurality of memory cells each including a memory storage element 23 disposed between the rim edge of a conductive well or tub 39 and a thermal conduction limiting conductor 33 that is vertically adjacent the rim edge. The thermal conduction limiting conductor 33 can be a multi-level conductor having a serpentine or generally square-wave profile. For example, the thermal conduction limiting conductor 33 can be a plurality of interconnected thermal conduction limiting conductive tubwells. Each memory cell further includes a control element 25 disposed between the base of the conductive tub 39 and a conductor 35 that is vertically adjacent the base of the conductive tub 39. The conductive tub 39 can be a thermal conduction limiting conductive structure.

By way of illustrative example, the thermal conduction limiting conductor 33 can be a column selection line while the conductor 35 can be a row selection line in a cross-point memory structure.

The memory storage element 23 can formed of an oxide of the conductive tub 39, and the control element 25 can be formed of an oxide of the conductor 35 that is vertically adjacent the base of the conductive tub 39. Alternatively, the memory storage element 23 can be formed of an oxide that is different from an oxide of the rim of the conductive tub 39, and the control element 25 can be formed of an oxide that is different from an oxide of the conductor 35. The memory storage element 23 can also be a portion of an unpatterned oxide layer that can be a deposited oxide layer or a completely oxidized deposited metal layer, for example. Similarly, the control element 25 can be a portion of an unpatterned oxide layer that can be a deposited oxide layer or a completely oxidized deposited metal layer, for example.

Figure 5:
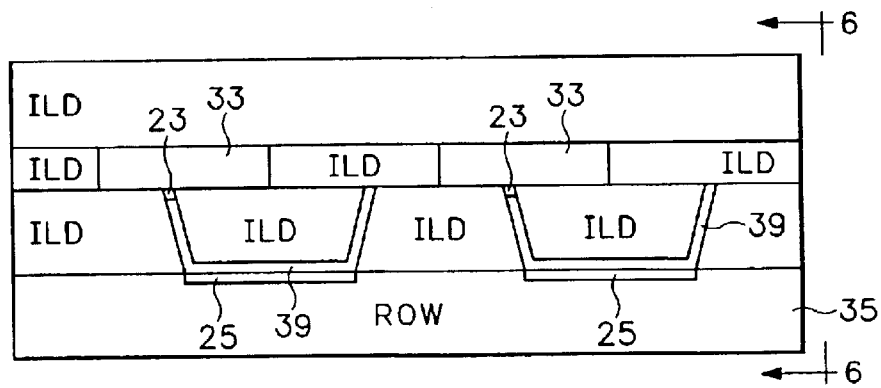
FIGS. 5 and 6 are sectional views that schematically depict a further embodiment of a memory structure that includes a thermal conduction limiting conductor.
Figure 6:
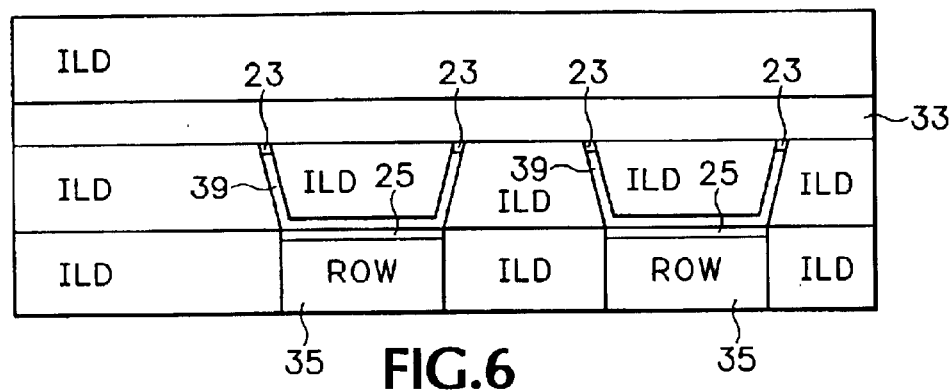

FIGS. 5 and 6 schematically depict an embodiment of a memory structure that includes a plurality of memory cells each including a memory storage element 23 disposed between the rim edge of a conductive well or tub 39 and a thermal conduction limiting conductor 33 that is vertically adjacent the rim edge. The thermal conduction limiting conductor 33 can be a relatively thin planar conductor, for example. Each memory cell further includes a control element 25 disposed between the base of the conductive tub 39 and a conductor 35 that is vertically adjacent the base of the conductive tub 39. The conductive tub 39 can be a thermal conduction limiting conductive structure.

By way of illustrative example, the thermal conduction limiting conductor 33 can be a column selection line while the conductor 35 can be a row selection line in a cross-point memory structure.

The memory storage element 23 can formed of an oxide of the conductive tub 39, and the control element 25 can be formed of an oxide of the conductor 35 that is vertically adjacent the base of the conductive tub 39. Alternatively, the memory storage element 23 can be formed of an oxide that is different from an oxide of the rim of the conductive tub 39, and the control element 25 can be formed of an oxide that is different from an oxide of the conductor 35. The memory storage element 23 can also be a portion of an unpatterned oxide layer that can be a deposited oxide layer or a completely oxidized deposited metal layer, for example. Similarly, the control element 25 can be a portion of an unpatterned oxide layer that can be a deposited oxide layer or a completely oxidized deposited metal layer, for example.

Figure 7:
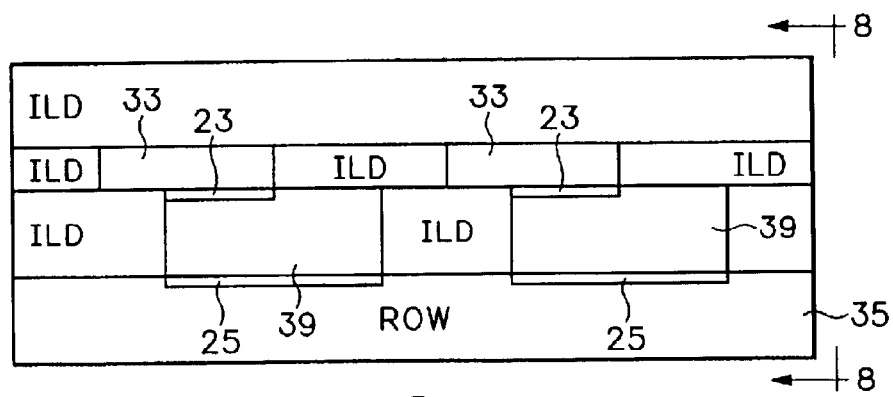
FIGS. 7 and 8 are sectional views that schematically depict another embodiment of a memory structure that includes a thermal conduction limiting conductor.
Figure 8:
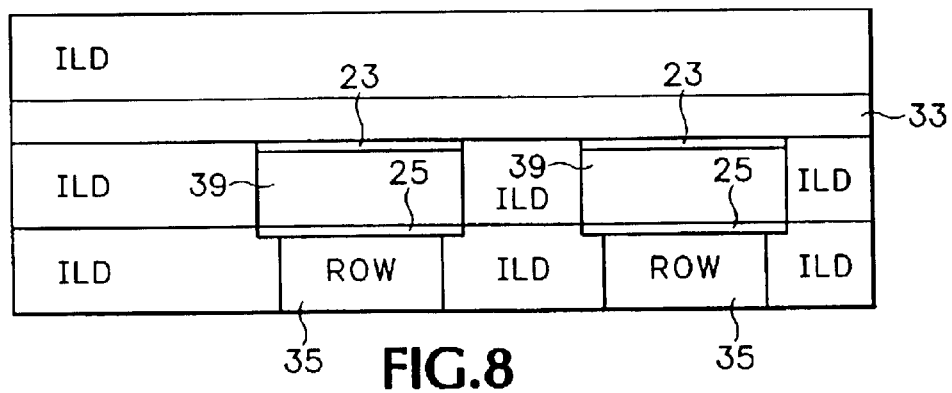

FIGS. 7 and 8 schematically depict an embodiment of a memory structure that includes a plurality of memory cells each including a memory storage element 23 disposed between a conductive block 39 and a thermal conduction limiting conductor 33 that is vertically adjacent the conductive block. The thermal conduction limiting conductor 33 can be a relatively thin conductor, for example. Each memory cell further includes a control element 25 disposed between the base of the conductive block 39 and a conductor 35 that is vertically adjacent the base of the conductive block 39. The conductive block 39 can be a thermal conduction limiting conductive structure.

By way of illustrative example, the thermal conduction limiting conductor 33 can be a column selection line while the conductor 35 can be a row selection line in a cross-point memory structure.

The memory storage element 23 can formed of an oxide of the conductive block 39, and the control element 25 can be formed of an oxide of the conductor 35 that is vertically adjacent the conductive block 39. Alternatively, the memory storage element 23 can be formed of an oxide that is different from an oxide of the conductive block 39, and the control element 25 can be formed of an oxide that is different from an oxide of the conductor 35. The memory storage element 23 can also be a portion of an unpatterned oxide layer that can be a deposited oxide layer or a completely oxidized deposited metal layer, for example. Similarly, the control element 25 can be a portion of an unpatterned oxide layer that can be a deposited oxide layer or a completely oxidized deposited metal layer, for example.

Figure 9:
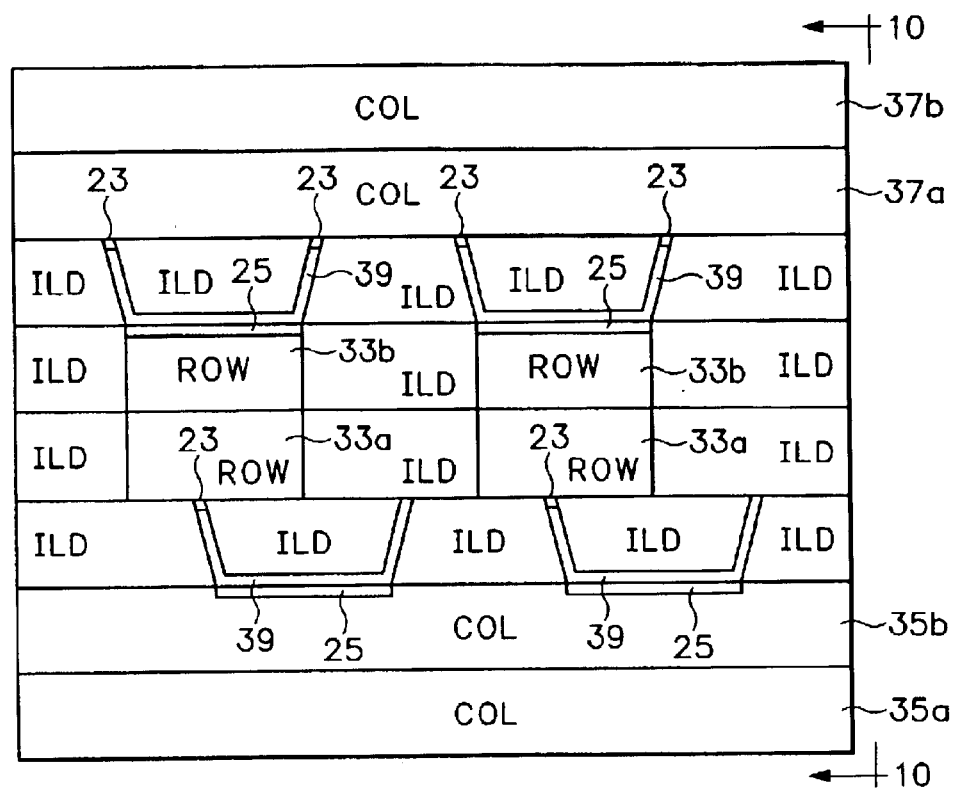
FIGS. 9 and 10 are sectional views that schematically depict an embodiment of a memory structure that includes a thermal conduction limiting conductor.
Figure 10:
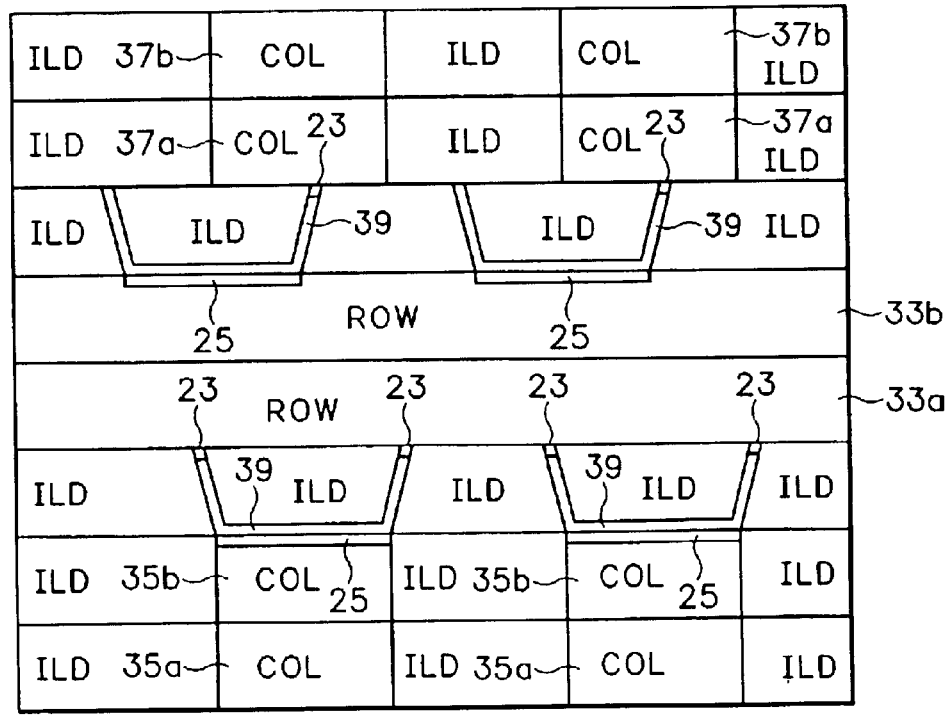

FIGS. 9 and 10 schematically depict an embodiment of a memory structure that includes a plurality of memory cells each including a memory storage element 23 disposed between the rim edge of a conductive well or tub 39 and a thermal conduction limiting conductor 33a or 37a that is vertically adjacent the rim edge. A conductor 33b or 37b is contactively disposed over the thermal conduction limiting conductor 33a or 37a. Each memory cell further includes a control element 25 disposed between the base of the conductive tub 39 and a conductor 35b or 33b that is vertically adjacent the base of the conductive tub 39. The conductive tub 39 can be a thermal conduction limiting conductive structure.

By way of illustrative example, the thermal conduction limiting conductor 33a and the overlying conductor 33b can form a laminar composite row selection line while the thermal conduction limiting conductor 37a and the overlying conductor 37b can form a laminar composite column selection line in a cross-point memory structure. Also, the conductor 35b and an underlying thermal conduction limiting conductor 35a can form a laminar composite column selection line.

The memory storage element 23 can be formed of an oxide of the conductive tub 39, and the control element 25 can be formed of an oxide of the conductor 35a or 33b that is vertically adjacent the base of the conductive tub 39. Alternatively, the memory storage element 23 can be formed of an oxide that is different from an oxide of the rim of the conductive tub 39, and the control element 25 can be formed of an oxide that is different from an oxide of the conductor 35b or 33b. The memory storage element 23 can also be a portion of an unpatterned oxide layer that can be a deposited oxide layer or a completely oxidized deposited metal layer, for example. Similarly, the control element 25 can be a portion of an unpatterned oxide layer that can be a deposited oxide layer or a completely oxidized deposited metal layer, for example.

Figure 11:
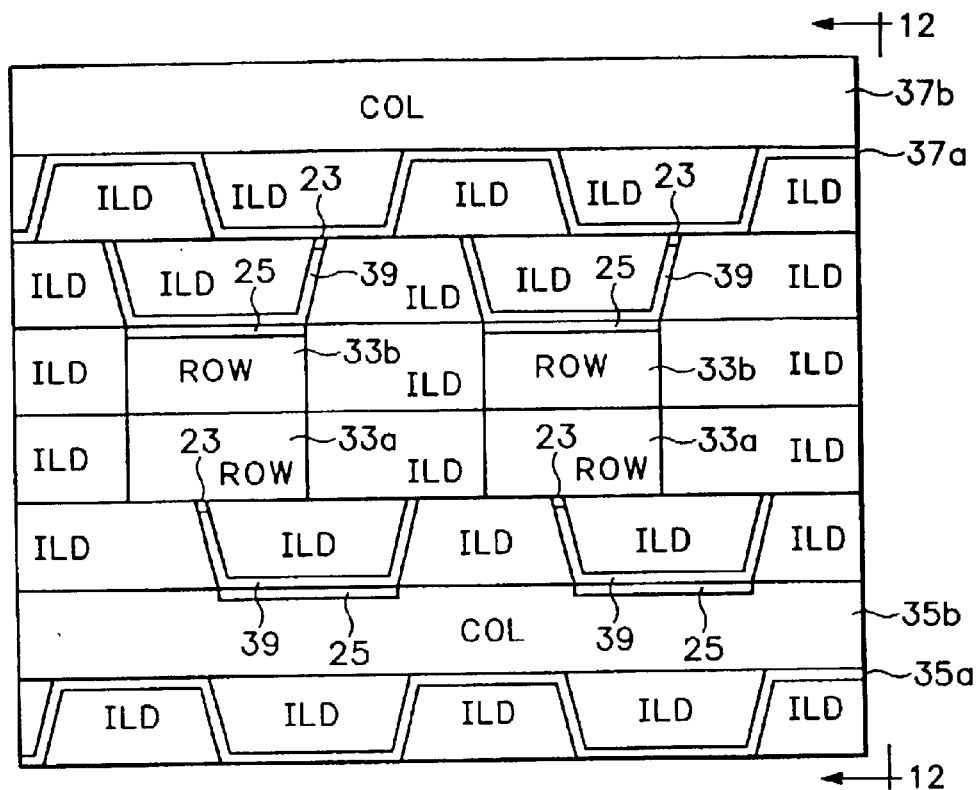
FIGS. 11 and 12 are sectional views that schematically depict another embodiment of a memory structure that includes a thermal conduction limiting conductor.
Figure 12:
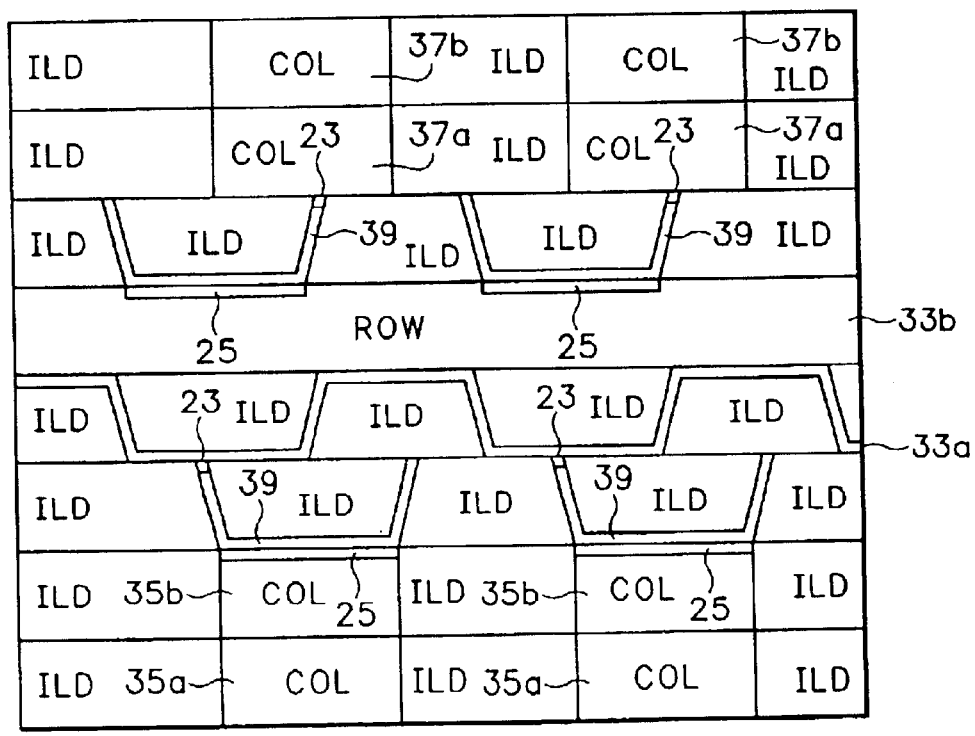

FIGS. 11 and 12 schematically depict an embodiment of a memory structure that includes a plurality of memory cells each including a memory storage element 23 disposed between the rim edge of a conductive well or tub 39 and a thermal conduction limiting conductor 33a or 37a that is vertically adjacent the rim edge. A conductor 33b or 37b is contactively disposed over the thermal conduction limiting conductor 33a or 37a which can be a multi-level conductor having a serpentine or generally square-wave profile. For example, the thermal conduction limiting conductor 33a or 37a can be a plurality of interconnected thermal conduction limiting conductive tubwells. Each memory cell further includes a control element 25 disposed between the base of the conductive tub 39 and a conductor 35b or 33b that is vertically adjacent the base of the conductive tub 39. The conductive tub 39 can be a thermal conduction limiting conductive structure.

By way of illustrative example, the thermal conduction limiting conductor 33a and the overlying conductor 33b can form a laminar composite row selection line while the thermal conduction limiting conductor 37a and the overlying conductor 37b can form a laminar composite column selection line in a cross-point memory structure. Also, the conductor 35b and an underlying thermal conduction limiting conductor 35a can form a laminar composite column selection line.

The memory storage element 23 can be formed of an oxide of the conductive tub 39, and the control element 25 can be formed of an oxide of the conductor 35a or 33b that is vertically adjacent the base of the conductive tub 39. Alternatively, the memory storage element 23 can be formed of an oxide that is different from an oxide of the rim of the conductive tub 39, and the control element 25 can be formed of an oxide that is different from an oxide of the conductor 35b or 33b. The memory storage element 23 can also be a portion of an unpatterned oxide layer that can be a deposited oxide layer or a completely oxidized deposited metal layer, for example. Similarly, the control element 25 can be a portion of an unpatterned oxide layer that can be a deposited oxide layer or a completely oxidized deposited metal layer, for example.

Figure 13:
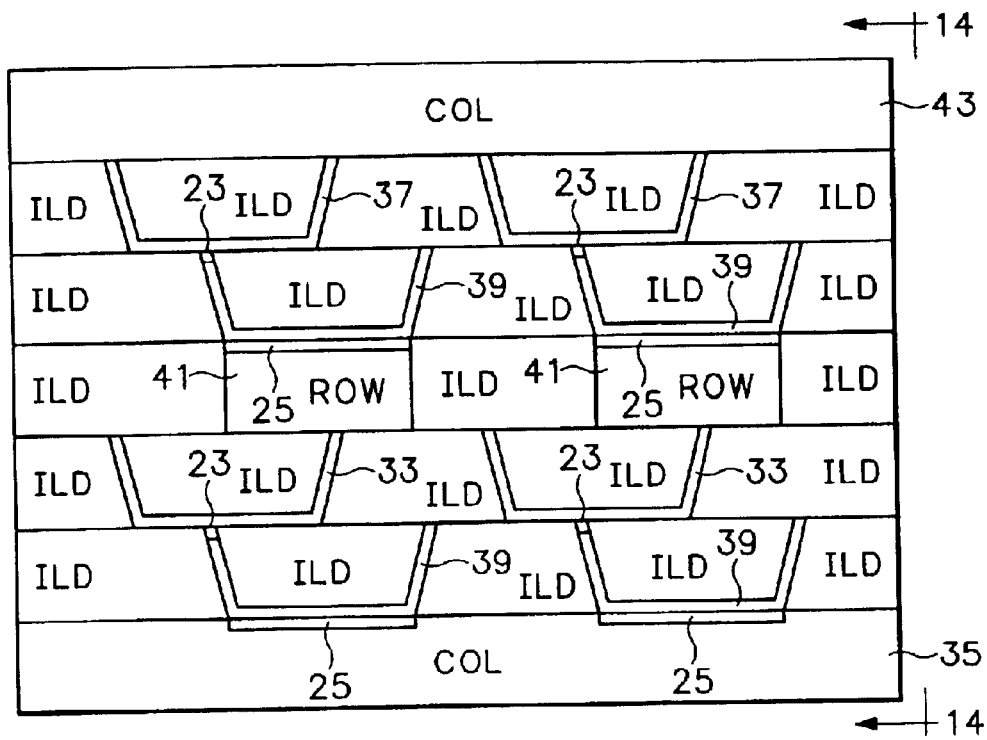
FIGS. 13 and 14 are sectional views that schematically depict still another embodiment of a memory structure that includes a thermal conduction limiting conductor.
Figure 14:
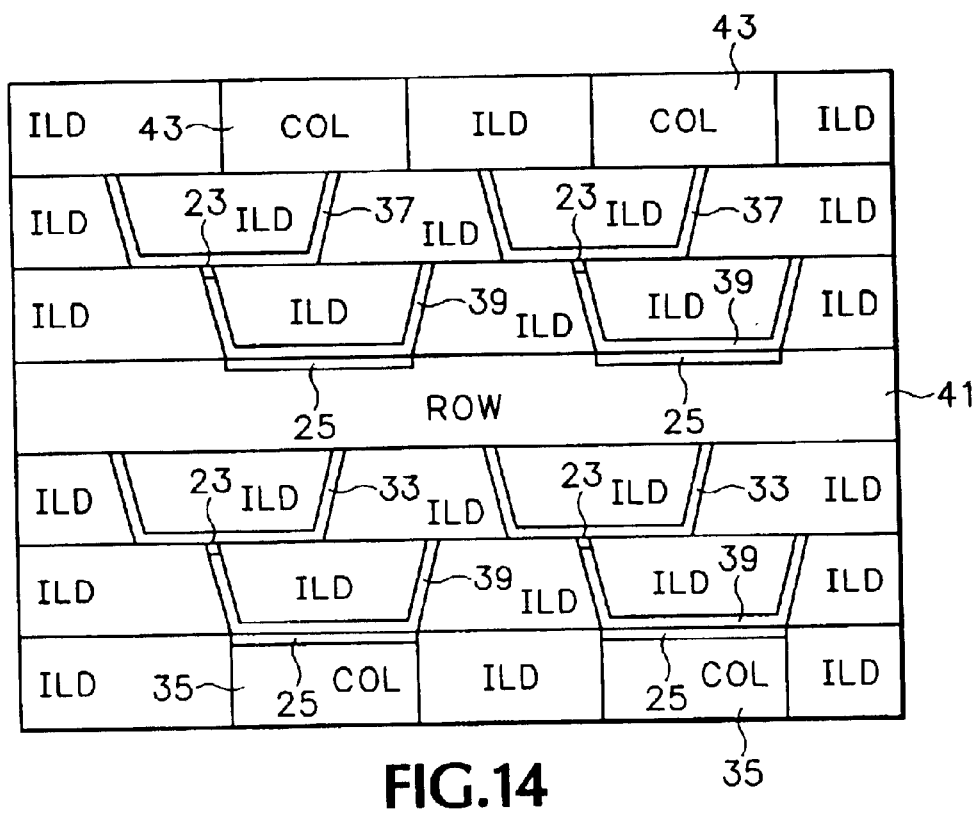

FIGS. 13 and 14 schematically depict an embodiment of a memory structure that includes a plurality of memory cells each including a memory storage element 23 disposed between the rim edge of a conductive well or tub 39 and the base of a thermal conduction limiting tubwell 33 or 37 that is vertically adjacent the rim edge of the conductive tub 39. A conductor 41 or 43 is contactively disposed over at least a portion of the rim of the thermal conduction limiting tubwell 33 or 37. Each memory cell further includes a control element 25 disposed between the base of the conductive tub 39 and a conductor 35 or 41 that is vertically adjacent the base of the conductive tub 39. The conductive tub 39 can be a thermal conduction limiting conductive structure.

By way of illustrative example, the conductor 35 or 43 can be a column selection line while the conductor 41 can form a row selection line in a cross-point memory structure.

The memory storage element 23 can be formed of an oxide of the conductive tub 39, and the control element 25 can be formed of an oxide of the conductor 35 or 41 that is vertically adjacent the base of the conductive tub 39. Alternatively, the memory storage element 23 can be formed of an oxide that is different from an oxide of the rim of the conductive tub 39, and the control element 25 can be formed of an oxide that is different from an oxide of the conductor 35 or 41. The memory storage element 23 can also be a portion of an unpatterned oxide layer that can be a deposited oxide layer or a completely oxidized deposited metal layer, for example. Similarly, the control element 25 can be a portion of an unpatterned oxide layer that can be a deposited oxide layer or a completely oxidized deposited metal layer, for example.

Figure 15:
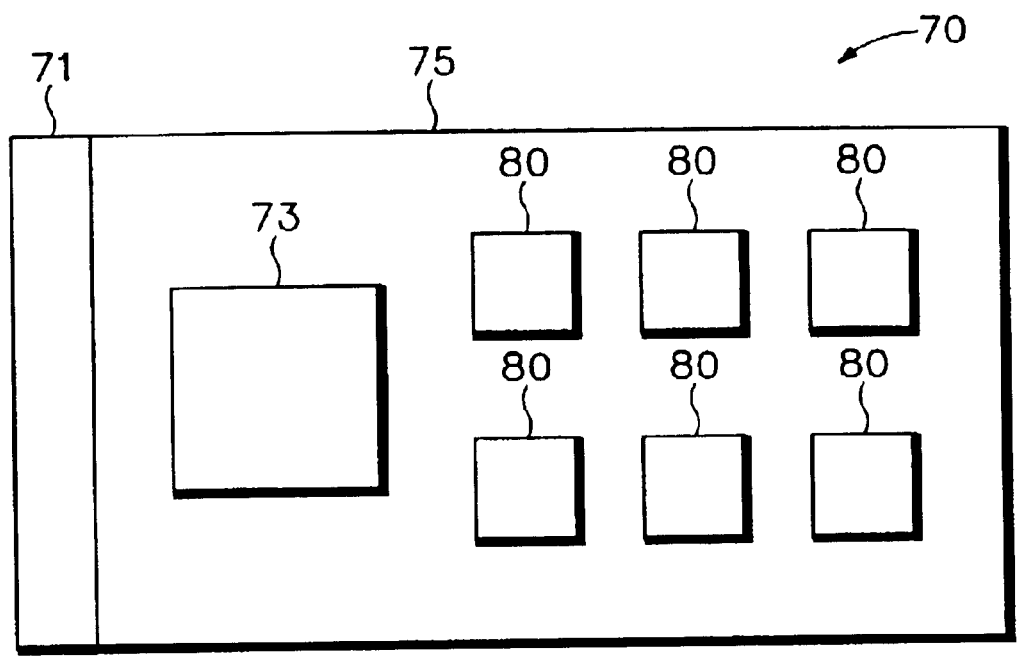
FIG. 15 is a schematic block diagram of an embodiment of a memory carrier that incorporates at least one of the disclosed memory structures.

FIG. 15 is a block diagram of an embodiment of a memory carrier 70 that incorporates at least one embodiment of the invention. The memory carrier represents any of standard or proprietary memory card formats such as PCMCIA, PC card, Smart memory, Memory Stick, digital film, ATA, and compact flash, to name a few. The memory carrier 70 includes a mechanical interface 71 that provides for mechanical and electrical connection with a particular connector for the type of memory carrier implemented. An optional electrical interface 73 makes electrical coupling with the electrical contacts on the mechanical connector 71 and provides for example security, address decoding, voltage translation, write protection, or other typical interface functions with a set of memory ICs 80 that incorporate at least one embodiment of the invention. A carrier 75, for example a printed circuit board or ceramic substrate, typically is used to physically support the memory ICs 80, electrical interface 73, and mechanical interface 71. It will be appreciated by those skilled in the art that some electrical devices might incorporate the functionality of the electrical interface 73, thereby obviating its need in the memory carrier 70.

Figure 16:
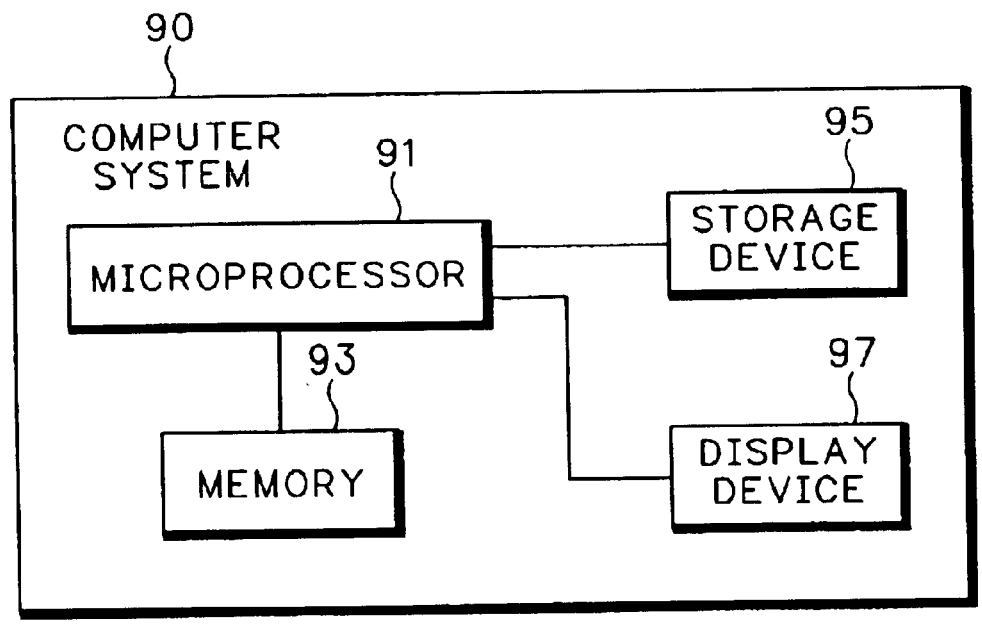
FIG. 16 is a schematic block diagram of an embodiment of an electronic device, such as a computer system, that incorporates at least one of the disclosed memory structures.

FIG. 16 is a block diagram of an embodiment of an electronic device, in this example a computer system 90, that incorporates at least one embodiment of the invention. In particular for a computer system, several different electrical devices as shown may be incorporated into the package. For example, a microprocessor 91 is coupled to a memory circuit 93 used to store computer executable instructions and/or user data. Exemplary memory circuits 93 include BIOS memory, random access memory (RAM), read only memory (ROM) and various levels of internal or external cache memory. The microprocessor 91 is also connected to a storage device 95 such as a hard disk drive, floppy drive, CD/DVD drive, tape drive or other mass storage devices such as those that incorporate semiconductor memory ICs that utilize the invention. The microprocessor 91 can include an internal cache memory that uses the invention. The memory 93 may also include memory ICs that use the invention. The microprocessor is further connected to a display device 97 that can also incorporate memory ICs that utilize the invention. The electronic device can also be configured to accept the memory carrier 70 of FIG. 15.

Figure 17:
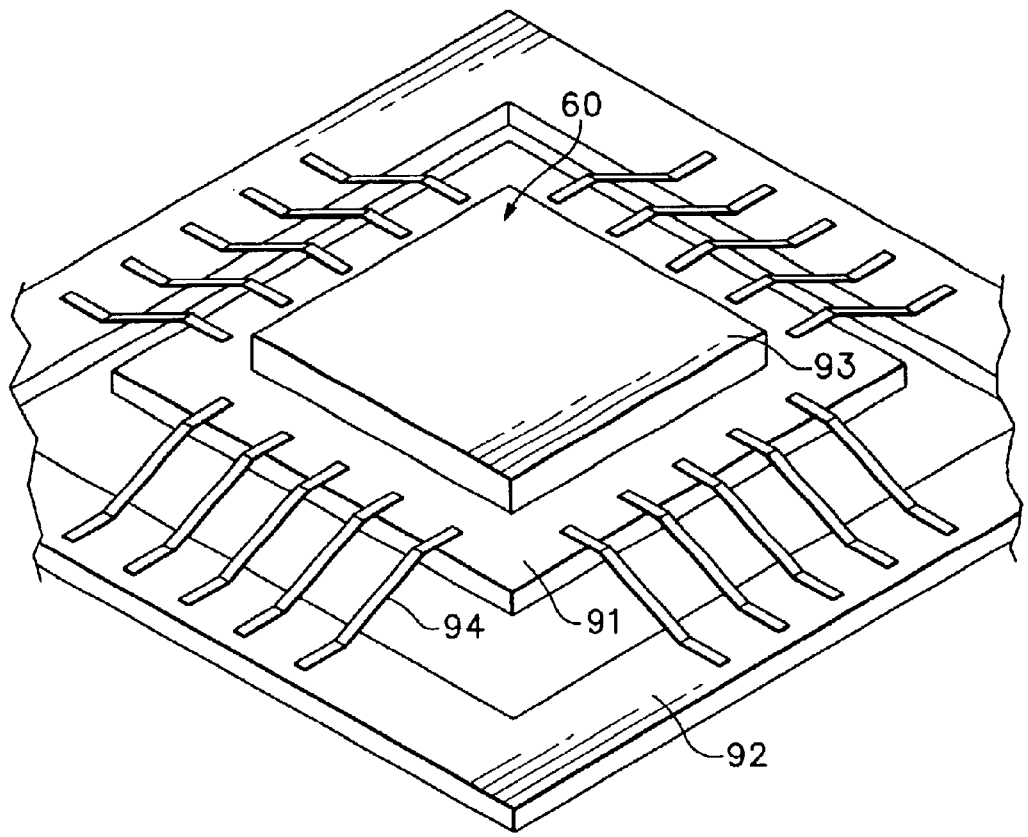
FIG. 17 is a schematic block diagram of an embodiment of an integrated circuit that embeds at least one of the disclosed memory structures.

FIG. 17 schematically depicts an exemplary embodiment of an embedded memory array 60 that integrates the memory 93 which uses the invention, such as level 1 and/or level 2 cache, with the microprocessor 91. The embedded memory array 60 is fabricated on top of the integrated circuit die of the microprocessor 91 which allows for a smaller die area size. The microprocessor 91 is electrically attached to a package 92 by bonding wires 94 or TAB circuit technology, for example. After the microprocessor is attached to the package 92, it is encapsulated (not shown) to provide protection from contaminants and handling. Although the embedded memory array 60 is shown as disposed on a microprocessor integrated circuit, it should be appreciated that any integrated circuit that utilizes memory circuits can be substituted for the microprocessor 91.

The disclosed memory structures can be implemented using semiconductor equipment. For example, the conductors can be formed by deposition of a metal layer followed by patterning by photolithographic masking and etching. Dielectric regions can be formed by deposition of dielectric material, while oxide layers can be formed by deposition of an oxide, deposition of a metal followed by oxidation of the deposited metal, or oxidation of a metal feature. Chemical mechanical polishing (CMP) can be employed to planarize and/or expose desired regions. Also, damascene processes such as dual damascene can be employed. In dual damascene processes, ILD is etched, metal is deposited on the etched ILD, and CMP is performed.

Figure 18:
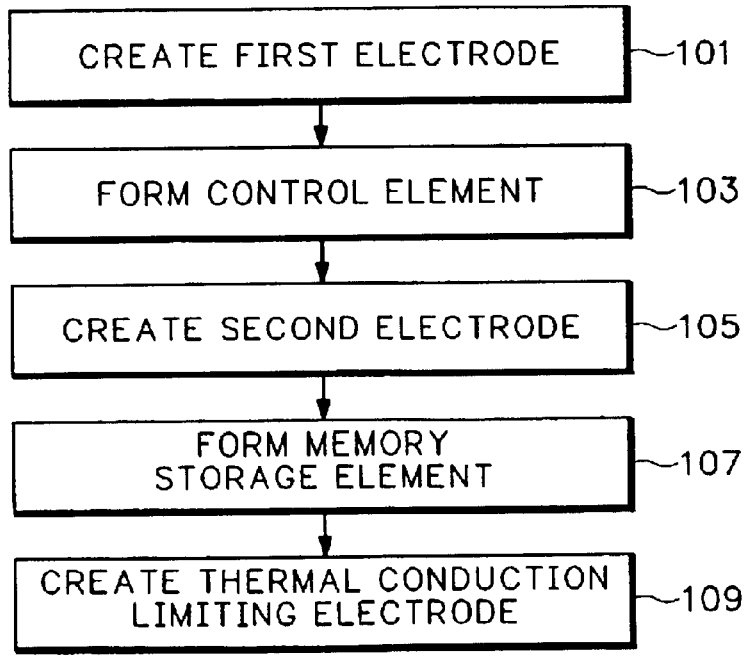
FIG. 18 is a flow diagram of an embodiment of basic steps that can be used to implement the disclosed memory structures.

Referring now to FIG. 18, the disclosed structures can generally be made as follows. At 101 a first electrode is created for example by depositing and patterning a metal layer. At 103 a control element is formed on the first electrode, for example by oxidizing the electrode or forming an unpatterned oxide layer as described above. At 105 a second electrode is created, for example by depositing and patterning a metal layer. The second electrode can be a thermal limiting conductor such as a thermal limiting tubwell. At 107 a memory storage element is formed on the edge of the second electrode, for example by oxidizing the electrode or forming an unpatterned oxide layer as described above. At 109 a thermal conduction limiting electrode is created in contact with the memory storage element.

Although the foregoing has been a description and illustration of specific embodiments of the invention, various modifications and changes thereto can be made by persons skilled in the art without departing from the scope and spirit of the invention as defined by the following claims.

What is claimed is:

1. A memory structure comprising:
   a first electrode;
   a second electrode;
   a thermal conduction limiting electrode having a thermal conductivity that is less than a thermal conductivity of the first electrode;
   a memory storage element disposed between the thermal conduction limiting electrode and the second electrode; and
   a control element disposed between the second electrode and the first electrode.

2. The memory structure of claim 1 wherein the thermal conduction limiting conductor comprises a material that is selected from the group consisting of titanium, tungsten and tantalum.

3. The memory structure of claim 1 wherein the second electrode includes a further thermal conduction limiting conductor having a thermal conductivity that is less than a thermal conductivity of the first electrode.

4. The memory structure of claim 1 wherein the second electrode includes a further thermal conduction limiting conductor comprising a material that is selected from the group consisting of titanium, tungsten and tantalum.

5. The memory structure of claim 1 wherein the second electrode comprises a conductive tubwell.

6. The memory structure of claim 1 wherein the second electrode comprises a thermal conduction limiting conductive tubwell.

7. The memory structure of claim 1 wherein the thermal conduction limiting electrode comprises a thin planar conductor.

8. The memory structure of claim 1 wherein the thermal conduction limiting electrode comprises a conductor having a generally serpentine cross-section.

9. The memory structure of claim 1 wherein the thermal conduction limiting electrode comprises a composite memory selection line that includes a thermal conduction limiting conductor.

10. The memory structure of claim 1 wherein the thermal conduction limiting electrode comprises a thermal conduction limiting conductive tubwell.

11. The memory structure of claim 1 wherein the memory storage element comprises an antifuse device.

12. The memory structure of claim 1 wherein the memory storage element comprises a tunnel junction device.

13. The memory structure of claim 1 wherein the memory storage element comprises either a silicide switch or a LeCombre switch device.

14. The memory structure of claim 1 wherein the memory storage element is selected from the group consisting of an antifuse, a fuse, a charge storage device, a resistive material, a trap-induced hysteresis material, a ferroelectric capacitor material, a Hall effect material, and a tunneling magneto-resistive material.

15. The memory structure of claim 1 wherein the memory storage element comprises an antifuse including material from the group consisting of an oxidized metal tunnel junction, a silicon dioxide tunnel junction, a dielectric-rupture, a polysilicon semiconductor, a polycrystalline semiconductor, an amorphous semiconductor, a microcrystalline semiconductor, a metal filament electro-migration semiconductor, and a polysilicon resistor semiconductor.

16. The memory structure of claim 1 wherein the memory storage element comprises a re-writable phase change material.

17. The memory structure of claim 1 wherein the control element comprises a tunnel junction device.

18. The memory structure of claim 1 wherein the control element comprises a diode.

19. The memory structure of claim 1 wherein the control element is selected from the group consisting of a recrystallized semiconductor, junction field effect transistor, a junction field effect transistor with its gate connected to its source or drain, a four-layer diode, an NPN transistor, and a PNP transistor.

20. An integrated circuit including the memory structure of claim 1.

21. An integrated circuit embedding the memory structure of claim 1.

22. A memory carrier including the memory structure of claim 1.

23. An electronic device capable of accepting the memory carrier of claim 22.

24. An electronic device including the memory structure of claim 1.

25. A memory structure comprising:
a first electrode;
a second electrode;
a thermal conduction limiting electrode having a thermal conductivity that is less than a thermal conductivity of the first electrode;
a tunnel junction memory storage element disposed between the thermal conduction limiting electrode and the second electrode; and
a tunnel junction control element disposed between the second electrode and the first electrode.

26. The memory structure of claim 25 wherein the thermal conduction limiting conductor comprises a material that is selected from the group consisting of titanium, tungsten and tantalum.

27. The memory structure of claim 25 wherein the second electrode includes a further thermal conduction limiting conductor having a thermal conductivity that is less than a thermal conductivity of the first electrode.

28. The memory structure of claim 25 wherein the second electrode includes a further thermal conduction limiting conductor comprising a material that is selected from the group consisting of titanium, tungsten and tantalum.

29. The memory structure of claim 25 wherein the second electrode comprises a conductive tubwell.

30. The memory structure of claim 25 wherein the second electrode comprises thermal conduction limiting conductive tubwell.

31. The memory structure of claim 25 wherein the thermal conduction limiting electrode comprises a thin planar conductor.

32. The memory structure of claim 25 wherein the thermal conduction limiting electrode comprises a conductor having a generally serpentine cross-section.

33. The memory structure of claim 25 wherein the thermal conduction limiting electrode comprises a composite memory selection line that includes a thermal conduction limiting conductor.

34. The memory structure of claim 25 wherein the thermal conduction limiting electrode comprises a thermal conduction limiting conductive tubwell.

35. An integrated circuit including the memory structure of claim 25.

36. An integrated circuit embedding the memory structure of claim 25.

37. A memory carrier including the memory structure of claim 25.

38. An electronic device configured to receive the memory carrier of claim 37.

39. An electronic device including the memory structure of claim 25.

40. A memory structure comprising:
a first electrode;
a second electrode;
means for electrically conducting and limiting thermal conduction;
a memory storage element disposed between said means for electrically conducting and the second electrode; and
a control element disposed between the second electrode and the first electrode.

41. A memory structure comprising:
a first electrode;
a thermal conduction limiting electrode; and
a memory storage element and a control element serially connected between the first electrode and the thermal conduction limiting electrode;
wherein the memory storage element is electrically connected to the control element by a second electrode.

42. A memory structure comprising:
a first electrode;
a second electrode;
a memory storage element electrically connected to the first electrode and the second electrode;
a control element electrically connected to the memory storage element by the second electrode; and
a thermal conduction limiting electrode electrically connected to the control element;
wherein the first electrode, the memory storage element, the second electrode, the control element and the thermal conduction limiting electrode are serially connected and wherein the second electrode is between the first electrode and the thermal conduction limiting electrode.

43. The memory structure of claim 42, wherein the first electrode comprises one of a row selection conductor line of a cross-point memory array or a column selection conductor line of a cross-point memory array.

44. The memory structure of claim 42, wherein the conduction limiting electrode comprises one of a row selection conductor line of a cross-point memory array or a column selection conductor line of a cross-point memory array.

45. The memory structure of claim 42, wherein the first electrode comprises one of a row selection conductor line of a cross-point memory array or a column selection conductor line of a cross-point memory array and the conduction limiting electrode comprises the other one of either the column selection conductor line of a cross-point memory array or the row selection conductor line of a cross-point memory array.

46. A memory structure comprising:
a first electrode;
a second electrode serially connected to the first electrode;

a thermal conduction limiting electrode having a thermal conductivity that is less than a thermal conductivity of the first electrode, the thermal conduction limiting electrode being serially connected with the first electrode and the second electrode, the second electrode being disposed between the first electrode and the thermal conduction limiting electrode;

a control element disposed between the first electrode and the second electrode; and a memory storage element disposed between the second electrode and the thermal conduction limiting electrode.

47. A cross-point memory array comprising:

a plurality of row selection conductor lines;

a plurality of column selection conductor lines; and a memory storage element electrically connected to a control element by an electrode, the memory storage element and the control element being serially connected between a thermal conduction limiting electrode and one of a first row selection conductor line or column selection conductor line.

* * * * *